United States Patent
Wang et al.

(10) Patent No.: US 9,507,897 B2
(45) Date of Patent: Nov. 29, 2016

(54) CIRCUIT ARRANGEMENT FOR MODELING TRANSISTOR LAYOUT CHARACTERISTICS

(71) Applicant: Taiwan Semiconductor Manufacturing Company Limited, Hsin-Chu (TW)

(72) Inventors: Yi-Ting Wang, Zhubei (TW); Chia-Ying Lin, Tainan (TW); Run-Ci Gao, Hukuo Township (TW); Hung-Han Lin, Hsinchu (TW); Chia-Chi Ho, Zhudong Township (TW); Chung-Shi Chiang, Zhubei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 31 days.

(21) Appl. No.: 14/457,357

(22) Filed: Aug. 12, 2014

(65) Prior Publication Data

US 2015/0363528 A1    Dec. 17, 2015

Related U.S. Application Data (60) Provisional application No. 62/012,309, filed on Jun. 14, 2014.

(51) Int. Cl.
  *G06F 17/50*    (2006.01)
  *H01L 29/00*    (2006.01)
  (Continued)

(52) U.S. Cl.
  CPC ......... *G06F 17/5036* (2013.01); *H03K 17/567* (2013.01); *H03K 17/60* (2013.01);
  (Continued)

(58) Field of Classification Search
  CPC ............... H01L 29/00; H01L 29/0603; H01L 29/0607; H01L 29/0611; H01L 29/08; H01L 29/0804; H01L 29/0821; H01L 29/0843; H01L 29/0847; G05F 3/26; G05F 3/2262; G05F 3/2265; G05F 3/2267; G05F 3/20; G05F 3/22; G05F 3/227; G05F 3/24; G05F 3/242
  USPC ............. 326/47–49; 327/564–566, 577–578, 327/580–581, 583–584; 703/13–14; 716/136
  See application file for complete search history.

(56) References Cited

U.S. PATENT DOCUMENTS 5,606,837 A * 3/1997 Holizlander .............. E04C 3/02
                                                        52/639
5,705,839 A * 1/1998 Hsu ..................... H01L 21/8249
                                                       257/336

(Continued)

OTHER PUBLICATIONS

Khanna, Vinod Kumar, "Power device evolution and the advent of IGBT", 2003, The insulated Gate Bipolar Transistor (IGBT) theory and design, Institute of Electrical and Electronics Engineers, pp. 1-33.*

*Primary Examiner* — Stacy Whitmore
(74) *Attorney, Agent, or Firm* — Cooper Legal Group, LLC (57) ABSTRACT

One or more circuit arrangements and techniques for modeling are provided. In some embodiments, a circuit arrangement includes at least one of a first current source, a second current source, a first diode, a second diode, and a switching component. In some embodiments, the switching component includes a bipolar junction transistor (BJT). In some embodiments, the circuit arrangement is integrated into a metal oxide semiconductor (MOS) device. When the circuit arrangement is integrated into a MOS device, at least one of a substrate current leakage, a junction breakdown, or a diode reverse recovery (DRR) effect is predictable for the MOS device.

20 Claims, 7 Drawing Sheets

(51) Int. Cl.
*G05F 3/00* (2006.01)
*H03K 17/567* (2006.01)
*H03K 17/60* (2006.01)
*G05F 3/24* (2006.01)
*G05F 3/20* (2006.01)
*H01L 29/08* (2006.01)
*H01L 29/06* (2006.01)
*G05F 3/22* (2006.01)
*G05F 3/26* (2006.01)

(52) U.S. Cl.
CPC .................. *G05F 3/20* (2013.01); *G05F 3/22* (2013.01); *G05F 3/227* (2013.01); *G05F 3/24* (2013.01); *G05F 3/242* (2013.01); *G05F 3/26* (2013.01); *H01L 29/00* (2013.01); *H01L 29/0603* (2013.01); *H01L 29/0607* (2013.01); *H01L 29/0611* (2013.01); *H01L 29/08* (2013.01); *H01L 29/0804* (2013.01); *H01L 29/0821* (2013.01); *H01L 29/0843* (2013.01); *H01L 29/0847* (2013.01)

(56) References Cited

U.S. PATENT DOCUMENTS

| | | | | |
|---|---|---|---|---|
| 5,744,994 A * | 4/1998 | Williams | ............ | H01L 27/0248 257/E29.064 |
| 5,920,489 A * | 7/1999 | Dibrino | ............... | G06F 11/2215 703/15 |
| 5,998,837 A * | 12/1999 | Williams | ............ | H01L 27/0255 257/328 |
| 6,023,577 A * | 2/2000 | Smith, III | ........... | G06F 17/5036 703/14 |
| 6,275,972 B1 * | 8/2001 | Long | ........................ | H01L 22/12 257/E21.53 |
| 6,557,150 B1 * | 4/2003 | Honmura | ............ | G06F 17/5022 716/113 |
| 6,787,437 B2 * | 9/2004 | Rumennik | .......... | H01L 29/0619 257/E21.417 |
| 6,828,631 B2 * | 12/2004 | Rumennik | .......... | H01L 29/0619 257/262 |
| 7,262,478 B2 * | 8/2007 | Takei | .................. | H01L 29/0649 257/124 |
| 7,268,003 B2 * | 9/2007 | Hayashi | ............. | G01R 31/2884 257/355 |
| 7,322,015 B2 * | 1/2008 | Liu | ...................... | G06F 17/5036 703/14 |
| 7,355,263 B2 * | 4/2008 | Takei | .................. | H01L 29/0649 257/335 |
| 7,569,431 B2 * | 8/2009 | Takei | .................. | H01L 29/0649 257/E21.382 |
| 8,692,289 B2 * | 4/2014 | Su | ........................ | H01L 27/0262 257/146 |
| 8,829,607 B1 * | 9/2014 | Hsieh | .................. | H01L 29/7827 257/329 |
| 8,901,967 B2 * | 12/2014 | Nakajima | ............ | H03K 5/2481 327/77 |
| 2002/0063252 A1 * | 5/2002 | Arai | .................... | G06F 17/5036 257/48 |
| 2003/0089960 A1 * | 5/2003 | Liu | ................... | H01L 29/66772 257/500 |
| 2003/0137015 A1 * | 7/2003 | Yedinak | .............. | H01L 29/0696 257/401 |
| 2004/0150049 A1 * | 8/2004 | Laville | ................ | H01L 27/0629 257/363 |
| 2004/0240128 A1 * | 12/2004 | Boselli | ................ | H01L 27/0266 361/56 |
| 2005/0065762 A1 * | 3/2005 | Hayashi | ............. | G06F 17/5036 703/14 |
| 2005/0196884 A1 * | 9/2005 | Hayashi | ............. | G01R 31/2884 438/17 |
| 2006/0001100 A1 * | 1/2006 | Kamei | ................ | G06F 17/5036 257/355 |
| 2008/0084197 A1 * | 4/2008 | Williams | ................ | H02M 1/38 323/282 |
| 2010/0244150 A1 * | 9/2010 | Bahl | .................. | H01L 29/6659 257/408 |
| 2011/0282639 A1 * | 11/2011 | Obradovic | .......... | G06F 17/5036 703/14 |
| 2012/0220091 A1 * | 8/2012 | Challa | ................ | H01L 21/3065 438/270 |
| 2013/0297277 A1 * | 11/2013 | Lu | ........................ | G06F 17/5036 703/13 |
| 2013/0313620 A1 * | 11/2013 | Morris | .................. | H01L 21/761 257/288 |
| 2014/0027815 A1 * | 1/2014 | Su | ...................... | H01L 27/0262 257/146 |

\* cited by examiner

CIRCUIT ARRANGEMENT FOR MODELING TRANSISTOR LAYOUT CHARACTERISTICS

RELATED APPLICATIONS

This application is a non-provisional filing of and claims priority to U.S. Provisional Application 62/012,309, filed on Jun. 14, 2014 and titled "CIRCUIT ARRANGEMENT FOR MODELING," which is incorporated herein by reference.

BACKGROUND

Modeling may be implemented for resource conservation and/or other purposes, such as to test a device before a physical manifestation of the device is produced. For example, a circuit comprising one or more metal oxide semiconductors (MOS) can be designed within a design kit environment. A design cycle of the circuit can comprise at least one of schematic design of the circuit, pre-simulation of the schematic, physical layout design of the circuit, verification between the schematic and the physical layout, or simulation of the physical layout.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more circuit arrangements and techniques for modeling are provided. In some embodiments, the circuit arrangement comprises a unified macro model. In some embodiments, the circuit arrangement comprises a first current source, a second current source, a first diode, a second diode, and a switching component, such as a bipolar junction transistor (BJT) or an insulated-gate bipolar transistor (IGBT), etc. In some embodiments, the circuit arrangement is used to model at least one of current leakage, junction breakdown, or diode reverse recovery (DRR) effect. In some embodiments, the DRR effect is modeled from a forward current of the switching component. In some embodiments, the junction breakdown includes a safe operation range check for the switching component. In some embodiments, the circuit arrangement is applied to a multi-terminal device, such as a metal oxide semiconductor (MOS) device comprising a BJT. In some embodiments, the BJT is a parasitic BJT. In some embodiments, the circuit arrangement adopts a modular concept to save modeling effort and reduce an impact on the MOS model flow. In some embodiments, when the circuit arrangement is integrated into a MOS device, at least one of current leakage, junction breakdown, or DRR effect is predictable for the MOS device.

Figure 1:
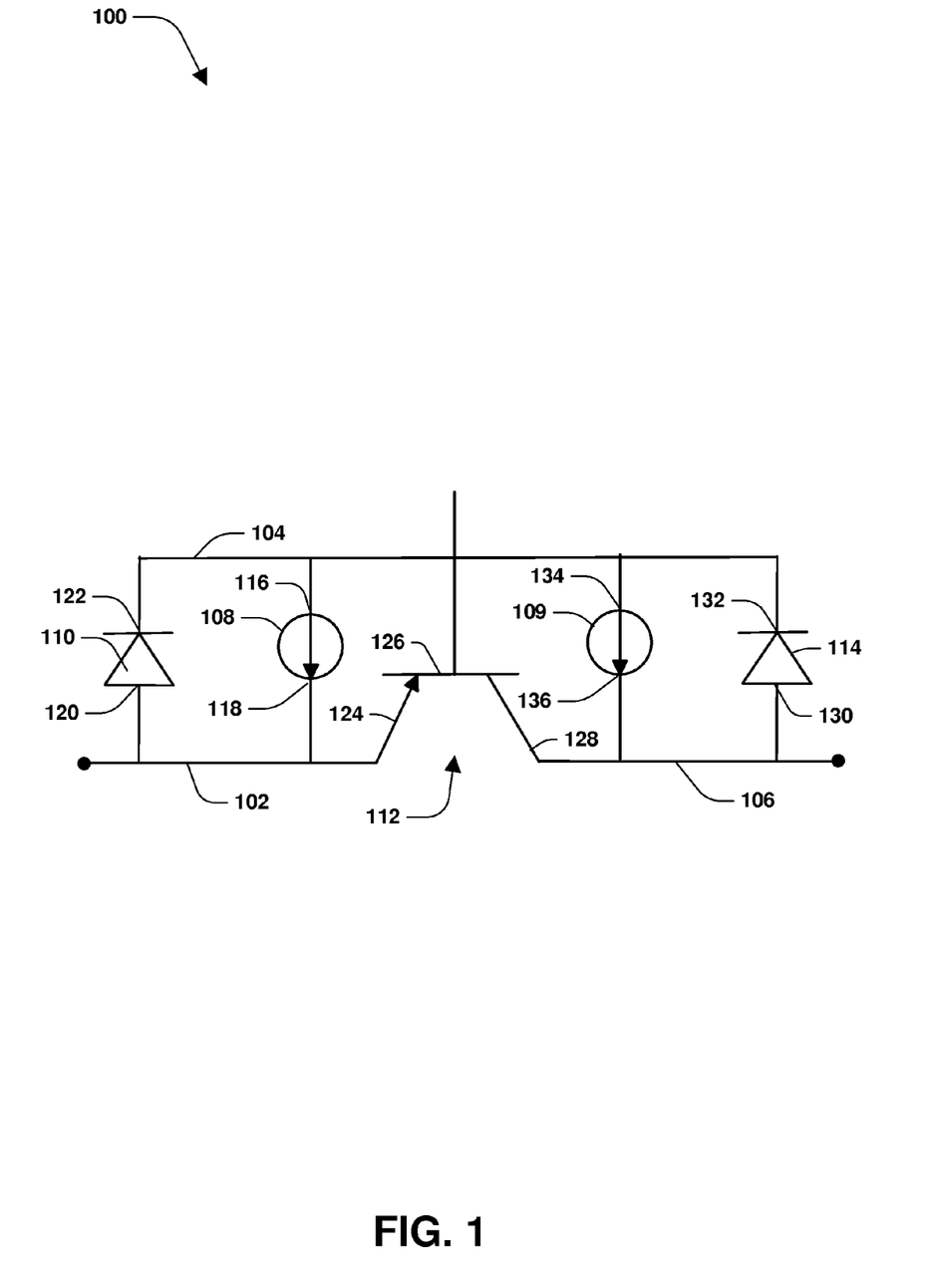
FIG. 1 is an illustration of a circuit arrangement, in accordance with some embodiments.

FIG. 1 illustrates a circuit arrangement 100 according to some embodiments. The circuit arrangement 100 comprises a first current source 108, a second current source 109, a first diode 110, a switching component 112, and a second diode 114. The first current source 108 comprises a first current input 116 and a first current output 118. In some embodiments, the second current source 109 comprises a second current input 134 and a second current output 136. In some embodiments, at least one of the current sources is an AC current source. In some embodiments, at least one of the current sources is a DC current source. In some embodiments, at least one of the current sources comprises a constant current diode. In some embodiments, at least one of the current sources outputs an AC current. In some embodiments, at least one of the current sources outputs a DC current. The first diode 110 comprises a first input node 120 and a first output node 122, and the second diode 114 comprises a second input node 130 and a second output node 132. In some embodiments, at least one of the first diode 110 or the second diode 114 is a p-n junction diode. In some embodiments, the switching component 112 has at least one of a first switching component node 124, a second switching component node 126, or a third switching component node 128. In some embodiments, at least one of the first switching component node 124, the second switching component node 126, or the third switching component node 128 comprises at least one of an emitter, a collector, or a base.

Figure 2:
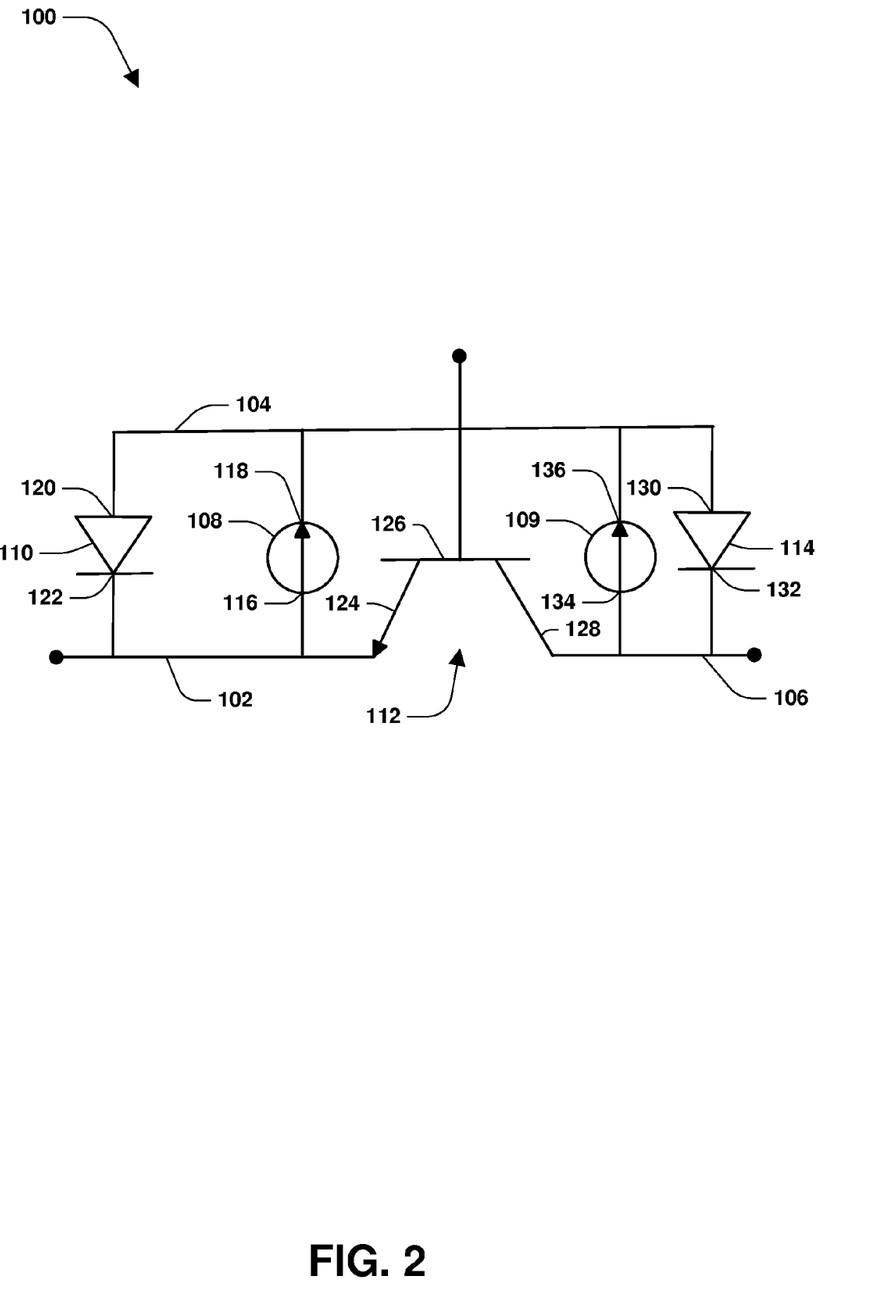
FIG. 2 is an illustration of a circuit arrangement, in accordance with some embodiments.
Figure 3:
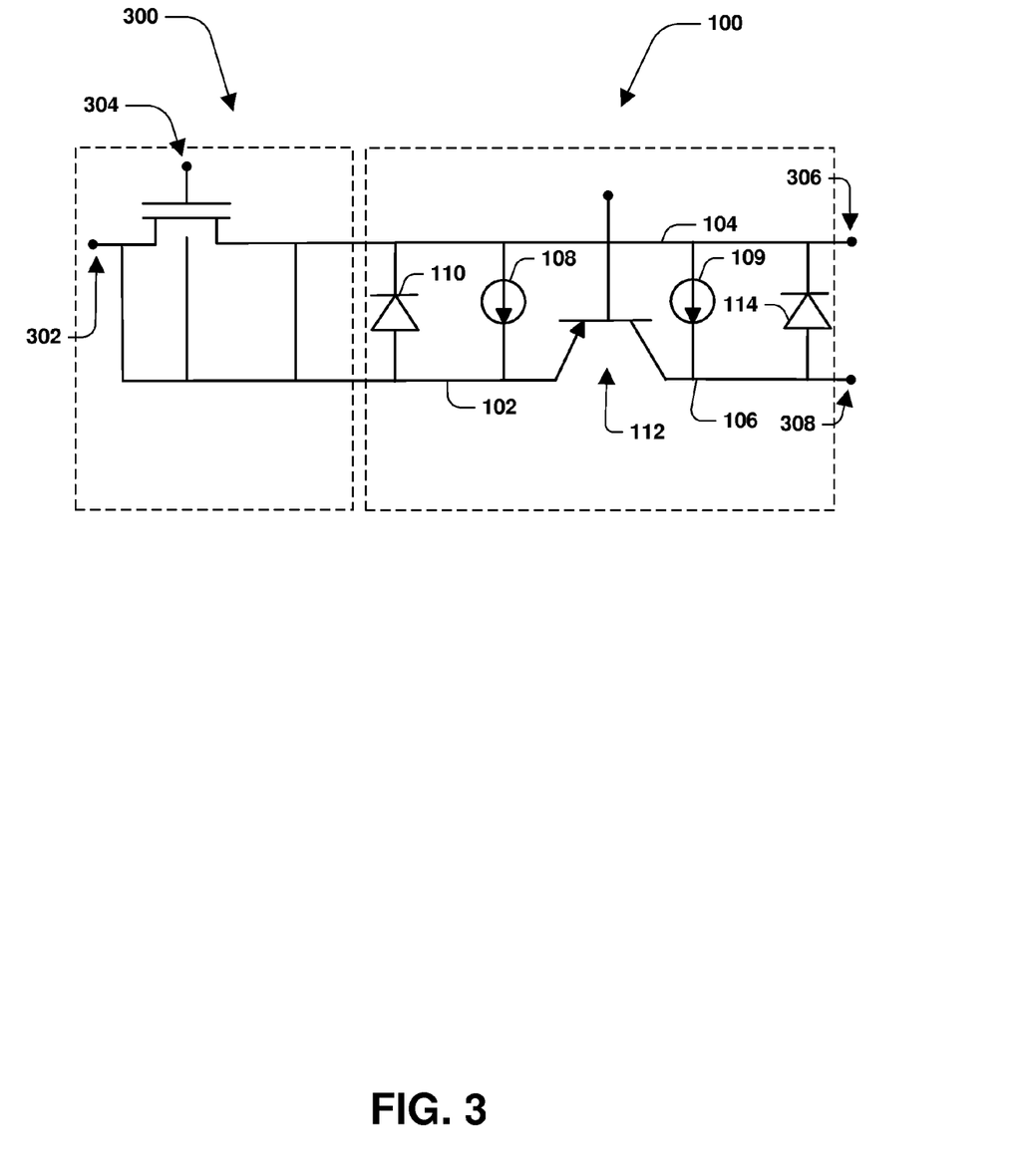
FIG. 3 is an illustration of a circuit arrangement, in accordance with some embodiments.

In some embodiments, at least one of the first current source 108, the second current source 109, the first diode 110, the switching component 112, or the second diode 114 is electrically connected to at least one of a first node 102, a second node 104, or a third node 106, as illustrated in FIGS. 1-3. In some embodiments, at least one of the first current source 108, the first diode 110, or the switching component 112 is electrically connected to the first node 102. In some embodiments, at least one of the first current source 108, the second current source 109, the first diode 110, the switching component 112, or the second diode 114 is electrically connected to the second node 104. In some embodiments, at least one of the second current source 109, the switching component 112 or the second diode 114 is electrically connected to the third node 106. In some embodiments, the first current source 108 and the first diode 110 are electrically connected in parallel. In some embodiments, the second diode 114 is electrically connected in parallel with the second current source 109. In some embodiments, when the switching component 112 is turned off the first node 102 is electrically isolated from the third node 106.

In some embodiments, the switching component 112 comprises a BJT, as illustrated in FIG. 1. In some embodiments, the BJT is at least one of a PNP BJT or a NPN BJT. In some embodiments, the first current output 118, the first input node 120, and the first switching component node 124 are electrically connected to the first node 102. In some embodiments, the first current input 116, the first output node 122, the second switching component node 126, the second current input 134, and the second output node 132 are electrically connected to the second node 104. In some embodiments, the second input node 130, the second current output 136, and the third switching component node 128 are electrically connected to the third node 106.

In some embodiments, as illustrated in FIG. 2, the switching component 112 comprises an insulated gate bipolar transistor (IGBT). In some embodiments, at least one of the first switching component node 124, the second switching component node 126, or the third switching component node 128 is at least one of an emitter, a collector, or a base. In some embodiments, the second switching component node 126 is a collector. In some embodiments, at least one of the first switching component node 124 or the third switching component node 128 is at least one of an emitter or a base. In some embodiments, the first current input 116, the first output node 122, and the first switching component node 124 are electrically connected to the first node 102. In some embodiments, the first current output 118, the first input node 120, the second switching component node 126, the second current output 136, and the second input node 130 are electrically connected to the second node 104. In some embodiments, the second output node 132, the second current input 134, and the third switching component node 128 are electrically connected to the third node 106.

FIG. 3 illustrates the circuit arrangement 100 electrically connected to a metal oxide semiconductor (MOS) device 300. In some embodiments, the MOS device 300 comprises at least one of a multiple gate field-effect transistor (MuGFET), a fin-based field-effect transistor (FinFET), a high voltage metal oxide semiconductor (HVMOS), or an insulated-gate filed-effect transistor (IGFET). In some embodiments, the MOS device 300 comprises at least one of a source region 302, a gate region 304, a drain region 306 or a body region 308. In some embodiments, at least one of the source region 302 or the drain region 306 is electrically connected to the circuit arrangement 100. In some embodiments, at least one of the source region 302 or the drain region 306 is electrically connected to at least one of the first node 102, the second node 104 or the third node 106. In some embodiments, the second node 104 is electrically connected to the drain region 306. In some embodiments, the third node 106 is electrically connected to the body region 308. In some embodiments, a current flows from the source region 302 through the switching component 112 and to at least one of the drain region 306 or the body region 308. In some embodiments, the first current source 108, the second current source 109, the first diode 110, the switching component 112, and the second diode 114 are configured to model at least one of current leakage, junction breakdown, or DRR effect of the MOS device 300.

Figure 4:
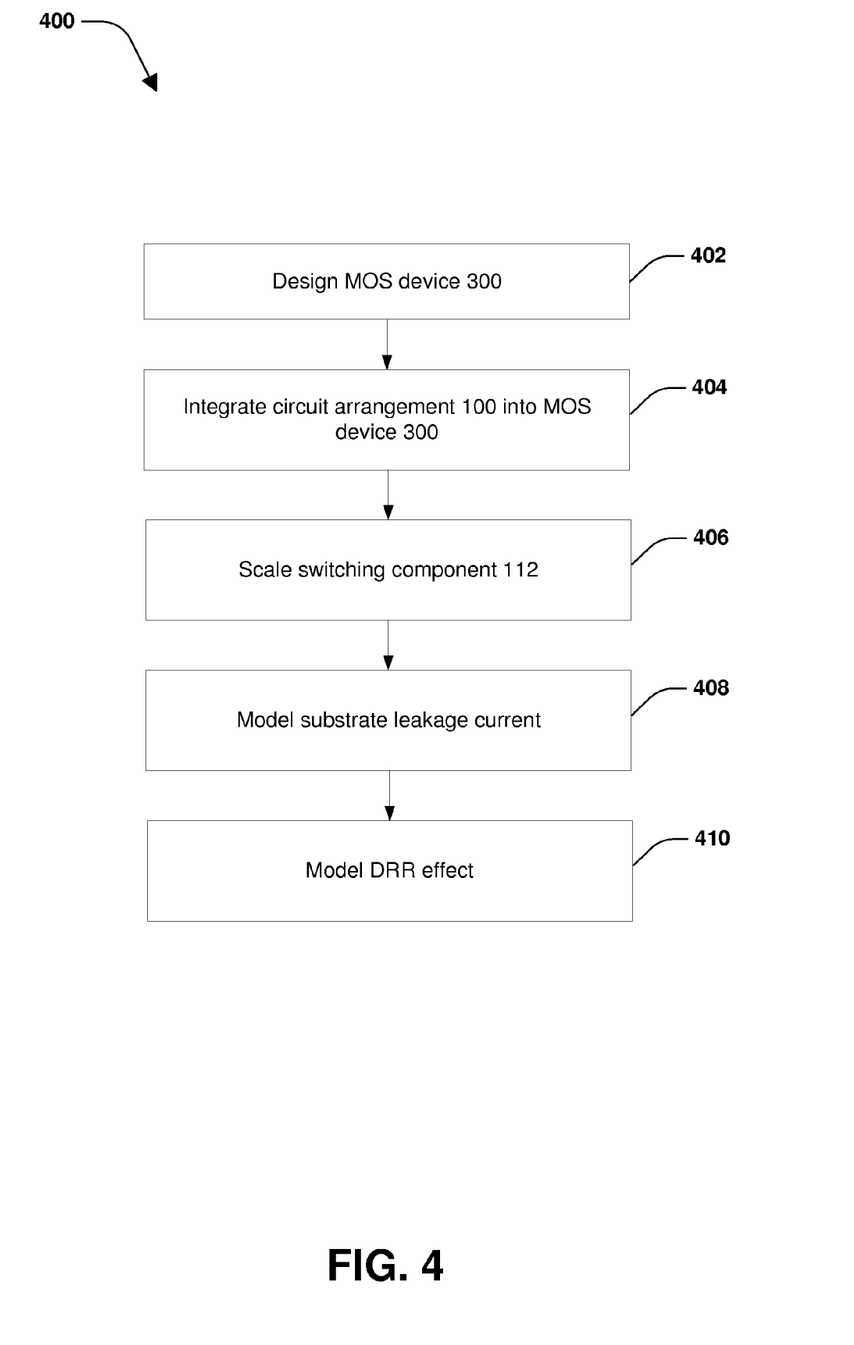
FIG. 4 is a flow diagram illustrating a method of modeling using a circuit arrangement, in accordance with some embodiments.

FIG. 4 illustrates a method 400 for modeling a MOS device, such as the MOS device 300. In some embodiments, the MOS device 300 is modeled as a macro device. At 402, the MOS device 300 is designed. In some embodiments, a MOS device 300 is designed within a design kit environment. In some embodiments, the design kit environment provides at least one of SPICE simulation functionality, layout verse schematic (LVS) verification functionality, RC extraction functionality, or other design functionality. In some embodiments, a design cycle of the MOS device comprises various phases, such as schematic design of the MOS device 300, a pre-simulation of the schematic design of the MOS device 300, a physical layout design of the MOS device 300, a verification between the schematic design and the physical layout design, a parasitic extraction for the physical layout design, such as extraction of parasitic elements within the MOS device 300, or a simulation of the physical layout design based upon the extraction of parasitic elements.

In some embodiments, the design of the MOS device 300 comprises at least one of a HVMOS, a MuGFET, a FinFET, or an IGFET. In some embodiments, the MOS device 300 comprises at least one of the source region 302, the gate region 304, the drain region 306, or the body region 308. In some embodiments, at least one of the source region 302, the gate region 304, the drain region 306, or the body region 308 comprises at least one terminal. In some embodiments, the MOS device 300 comprises at least three terminals.

At 404, a circuit arrangement 100 is integrated into the layout design for the MOS device 300. In some embodiments, at least one of the first node 102, the second node 104, or the third node 106 of the circuit arrangement 100 is electrically connected to at least one of the source region 302, the gate region 304, the drain region 306, or the body region 308 of the MOS device. In some embodiments, the circuit arrangement 100 is electrically connected to at least three of the terminals of the MOS device 300.

At 406, the size of the switching component 112 is scaled. In some embodiments, the switching component 112 is scaled based upon at least one of a width of a channel of the MOS device 300 or a length of the channel of the MOS device 300. In some embodiments, the switching component 112 is proportional to at least one of the width or the length of the channel of the MOS device.

At 408, a substrate leakage current is modeled. In some embodiments, the circuit arrangement 100 is used to model the substrate leakage current of the MOS device 300. In some embodiments, the switching component 112 models a DC characteristic of the MOS device 300. In some embodiments, a SPICE GUMMEL POON model is used to model the substrate leakage current.

In some embodiments, the MOS device 300 will be turned off and a bias will be forced through the switching component 112 to the drain region 306. In some embodiments, the drain region 306 will be biased and the current at the substrate will be modeled. In some embodiments, an ID curve for at least one of the current or the bias is obtained. In some embodiments, a current to bias relationship is modeled to determine the substrate leakage current. In some embodiments, the substrate current leakage is proportional to power loss of the MOS device 300. In some embodiments, the leakage current is tuned for the MOS device 300. In some embodiments, a junction breakdown for the MOS device 300 is modeled based upon the junction breakdown of at least one of the first diode 110 or the second diode 114.

At 410, a diode reverse recovery (DRR) characteristic of the MOS device 300 is modeled. In some embodiments, the circuit arrangement 100 is used to model the DRR characteristic of the MOS device 300. In some embodiments, the DRR characteristic is determined based upon at least one of a SPICE based model, a physical based model, or by a measured data based model. In some embodiments, at least one of a first junction or a second junction of the switching device 112 is turned off rapidly. In some embodiments, after at least one of the first junction or the second junction of the switching device 112 is turned off, a temporary residual forward conduction causes an excess charge to be stored in at least one of the first junction or the second junction of the switching device 112. The excess charge causes a reverse current to flow in at least one of the first current source 108 or the second current source 109 until the excess charge is depleted. In some embodiments, at least one of the first current source 108 or the second current source 109 is used to model the DRR characteristic of the MOS device 300 based on the DC current from the switching component 112. In some embodiments, the DC current is a forward DC current. In some embodiments, the switching component 112 is turned off and at least one of the first current source 108 or the second current source 109 is used to model the DRR characteristic.

Figure 5:
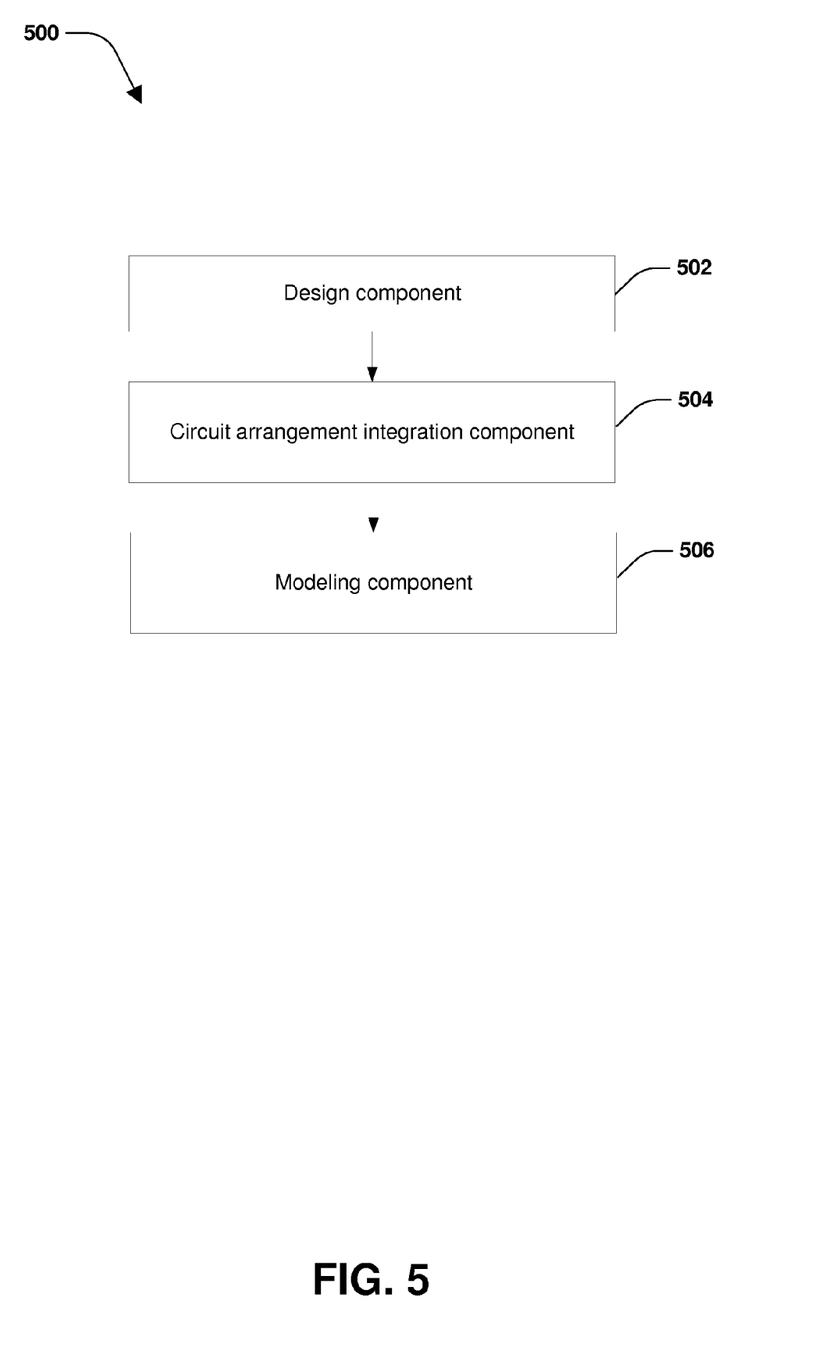
FIG. 5 is a diagram illustrating a system for modeling using a circuit arrangement, in accordance with some embodiments.

FIG. 5 illustrates a system 500 for modeling. The system 500 comprises a design component 502, a circuit arrangement integration component 504, and a modeling component 506. The design component 502 is configured to design a layout of the MOS device 300. The circuit arrangement integration component 504 is configured to integrate the circuit arrangement 100 into the layout of the MOS device 300. In some embodiments, the circuit arrangement 100 comprises the first current source 108, the first diode 110, the switching component 112, the second current source 109, and the second diode 114. The modeling component 506 is configured to model at least one of the current leakage, the junction breakdown, or the DRR effect of the MOS device 300 based upon the circuit arrangement 100.

Figure 6:
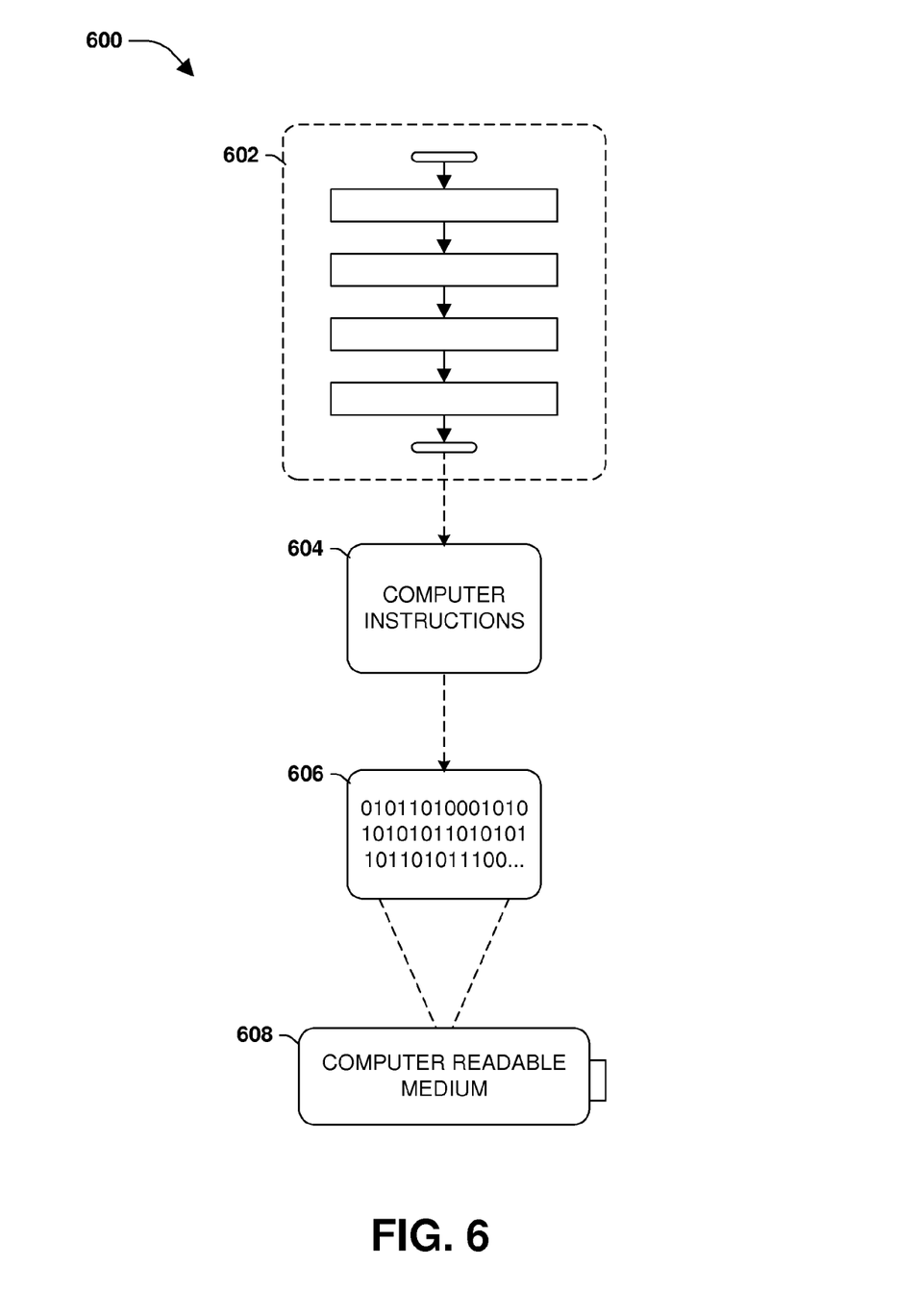
FIG. 6 is an illustration of an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 6, wherein the implementation 600 comprises a computer-readable medium 608 (e.g., a CD-R, DVD-R, flash drive, a platter of a hard disk drive, etc.), on which is encoded computer-readable data 606. This computer-readable data 606 in turn comprises a set of computer instructions 604 configured to operate according to one or more of the principles set forth herein. In one such embodiment 600, the processor-executable computer instructions 604 may be configured to perform a method 602, such as at least some of the exemplary method 400 of FIG. 4, for example. In another such embodiment, the processor-executable instructions 604 may be configured to implement a system, such as at least some of the exemplary system 500 of FIG. 5, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 7:
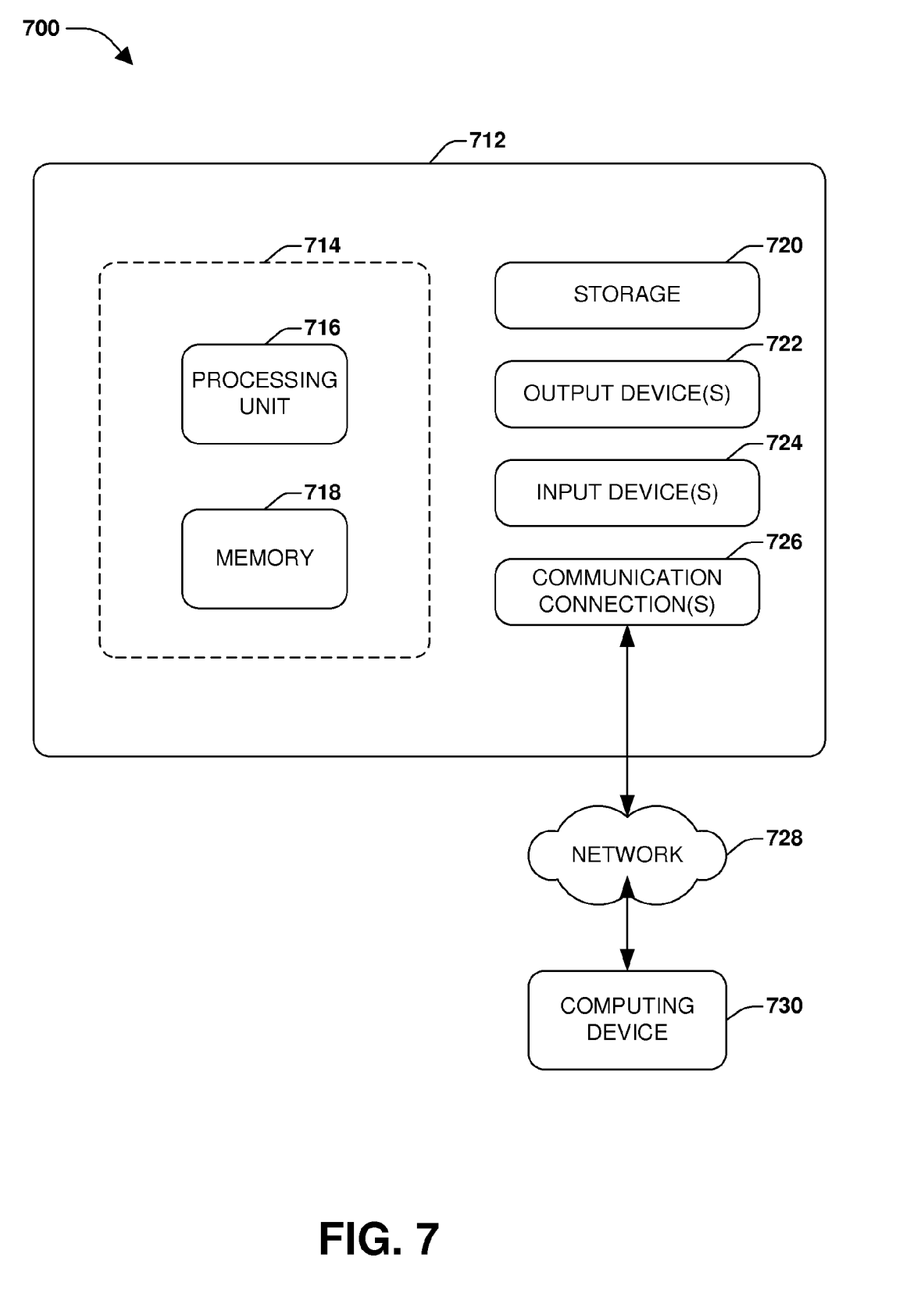
FIG. 7 illustrates an example computing environment wherein one or more of the provisions set forth herein may be implemented, in accordance with some embodiments.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 illustrates an example of a system 700 comprising a computing device 712 configured to implement one or more embodiments provided herein. In one configuration, computing device 712 includes at least one processing unit 716 and memory 718. Depending on the exact configuration and type of computing device, memory 718 may be volatile (such as RAM, for example), non-volatile (such as ROM, flash memory, etc., for example) or some combination of the two. This configuration is illustrated in FIG. 7 by dashed line 714.

In other embodiments, device 712 may include additional features and/or functionality. For example, device 712 may also include additional storage (e.g., removable and/or non-removable) including, but not limited to, magnetic storage, optical storage, and the like. Such additional storage is illustrated in FIG. 7 by storage 720. In some embodiments, computer readable instructions to implement one or more embodiments provided herein may be in storage 720. Storage 720 may also store other computer readable instructions to implement an operating system, an application program, and the like. Computer readable instructions may be loaded in memory 718 for execution by processing unit 716, for example.

The term "computer readable media" as used herein includes computer storage media. Computer storage media includes volatile and nonvolatile, removable and non-removable media implemented in any method or technology for storage of information such as computer readable instructions or other data. Memory 718 and storage 720 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 712. Any such computer storage media may be part of device 712.

Device 712 may also include communication connection(s) 726 that allows device 712 to communicate with other devices. Communication connection(s) 726 may include, but is not limited to, a modem, a Network Interface Card (NIC), an integrated network interface, a radio frequency transmitter/receiver, an infrared port, a USB connection, or other interfaces for connecting computing device 712 to other computing devices. Communication connection(s) 726 may include a wired connection or a wireless connection. Communication connection(s) 726 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 712 may include input device(s) 724 such as keyboard, mouse, pen, voice input device, touch input device, infrared cameras, video input devices, and/or any other input device. Output device(s) 722 such as one or more displays, speakers, printers, and/or any other output device may also be included in device 712. Input device(s) 724 and output device(s) 722 may be connected to device 712 via a wired connection, wireless connection, or any combination thereof. In some embodiments, an input device or an output device from another computing device may be used as input device(s) 724 or output device(s) 722 for computing device 712.

Components of computing device 712 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 712 may be interconnected by a network. For example, memory 718 may be comprised of multiple physical memory units located in different physical locations interconnected by a network.

Those skilled in the art will realize that storage devices utilized to store computer readable instructions may be distributed across a network. For example, a computing device 730 accessible via a network 728 may store computer readable instructions to implement one or more embodiments provided herein. Computing device 712 may access computing device 730 and download a part or all of the computer readable instructions for execution. Alternatively, computing device 712 may download pieces of the computer readable instructions, as needed, or some instructions may be executed at computing device 712 and some at computing device 730.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to some embodiments, a circuit arrangement is provided. The circuit arrangement comprises a first current source having a first current input and a first current output, a second current source having a second current input and a second current output, a first diode having a first input node and a first output node, a switching component having a first switching component node, a second switching component node, and a third switching component node, a second diode having a second input node and a second output node, a first node electrically connected to the first current source, the first diode, and the switching component, a second node electrically connected to the first current source, the second current source, the first diode, the switching component, and the second diode, and a third node electrically connected to the switching component, the second current source, and the second diode.

According to some embodiments, a system is provided. The system comprises a circuit arrangement and a MOS device. The circuit arrangement comprises a first current source having a first current input, and a first current output, a second current source having a second current input and a second current output, a first diode having a first input node and a first output node, a switching component having a first switching component node, a second switching component node, and a third switching component node, a second diode having a second input node and a second output node, a first node electrically connected to the first current source, the first diode, and the switching component, a second node electrically connected to the first current source, the second current source, the first diode, the switching component, and the second diode, and a third node electrically connected to the switching component, the second current source, and the second diode. The MOS device is electrically connected to at least one of the first node, the second node, or the third node of the circuit arrangement.

According to some embodiments, a method of modeling a metal-oxide semiconductor (MOS) device is provided. The method comprises designing a MOS device, integrating a circuit arrangement into a layout of the MOS device, modeling a diode reverse recovery effect, and modeling a substrate leakage current. The circuit arrangement comprises a first current source, a second current source, a first diode, a second diode, and a switching component disposed between the first diode and the second diode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A circuit arrangement comprising:
    a first current source having a first current input and a first current output;
    a second current source having a second current input and a second current output;
    a first diode having a first input node and a first output node;
    a switching component having a first switching component node, a second switching component node, and a third switching component node; and
    a second diode having a second input node and a second output node;
    a first node electrically connected to the first current source, the first diode, and the switching component;
    a second node directly electrically connected to the first diode, the switching component, and the second diode; and
    a third node electrically connected to the switching component, the second current source and the second diode.

2. The circuit arrangement of claim 1, wherein
    the first current output, the first input node, and the first switching component node are directly electrically connected to the first node;
    the first current input, the second current input, the first output node, the second switching component node, and the second output node are directly electrically connected to the second node; and
    the second input node, the second current output and the third switching component node are directly electrically connected to the third node.

3. The circuit arrangement of claim 1, wherein
    the first current input, the first output node, and the first switching component node are directly electrically connected to the first node;
    the first current output, the first input node, the second switching component node, the second current output and the second input node are directly electrically connected to the second node; and
    the second output node, the second current input and the third switching component node are directly electrically connected to the third node.

4. The circuit arrangement of claim 1, the switching component comprising:
    an-emitter;
    a base; and
    a collector.

5. The circuit arrangement of claim 1, wherein the switching component comprises at least one of a bipolar junction transistor (BJT) or an insulated-gate bipolar transistor (IGBT).

6. The circuit arrangement of claim 5, wherein the BJT is one of a PNP BJT or a NPN BJT.

7. The circuit arrangement of claim 1, wherein at least one of the first node, the second node, or the third node is electrically connected to a metal oxide semiconductor (MOS) device.

8. The circuit arrangement of claim 7, wherein a source/drain region the MOS device is directly electrically connected to first current source, the second current source, the first diode, the switching component, and the second diode.

9. The circuit arrangement of claim 1, wherein the second node is directly electrically connected to the first current source and the second current source.

10. A system comprising:
a circuit arrangement comprising:
  a first current source having a first current input, and a first current output;
  a second current source having a second current input, and a second current output;
  a first diode having a first input node and a first output node;
  a switching component having a first switching component node, a second switching component node, and a third switching component node;
  a second diode having a second input node and a second output node;
  a first node electrically connected to the first current source, the first diode, and the switching component;
  a second node directly electrically connected to the first current source, the first diode, the switching component, the second current source and the second diode; and
  a third node electrically connected to the switching component, the second current source and the second diode; and
a metal oxide semiconductor (MOS) device electrically connected to at least one of the first node, the second node, or the third node.

11. The system of claim 10, wherein the first current source and the first diode are electrically connected in parallel.

12. The system of claim 10, the MOS device comprising:
a source region;
a gate region; and
a drain region.

13. The system of claim 12, wherein the second node is electrically connected to the drain region.

14. The system of claim 10, wherein
the first current output, the first input node, and the first switching component node are directly electrically connected to the first node;
the first current input, the first output node, the second switching component node, the second current input and the second output node are directly electrically connected to the second node; and
the second input node, the second current output and the third switching component node are directly electrically connected to the third node.

15. The system of claim 10, wherein
the first current input, the first output node, and the first switching component node are directly electrically connected to the first node;
the first current output, the first input node, the second switching component node, the second current output and the second input node are directly electrically connected to the second node; and
the second output node, the second current input and the third switching component node are directly electrically connected to the third node.

16. The system of claim 10, wherein the switching component includes at least one of a bipolar junction transistor (BJT) or an insulated-gate bipolar transistor (IGBT).

17. The system of claim 10, wherein the first current source, the first diode, and the switching component are directly electrically connected to the first node.

18. A system comprising:
a circuit arrangement comprising:
  a first current source;
  a first diode electrically connected in parallel with the first current source;
  a second current source;
  a second diode electrically connected in parallel with the second current source; and
  a transistor; and
a metal oxide semiconductor (MOS) device, wherein:
  a source/drain region of the MOS device is directly connected to the first current source, the first diode, the second current source, the second diode, and the transistor at a first node.

19. The system of claim 18, wherein the transistor is at least one of a bipolar junction transistor (BJT) or an insulated-gate bipolar transistor (IGBT).

20. The system of claim 18, wherein the first current source, the first diode, and the transistor are directly electrically connected at a second node different than the first node.

* * * * *